(12) United States Patent
Wakelin (10) Patent No.: US 7,160,368 B1
(45) Date of Patent: Jan. 9, 2007

(54) SYSTEM AND METHOD FOR GETTERING GAS-PHASE CONTAMINANTS WITHIN A SEALED ENCLOSURE

(75) Inventor: Suzanne Wakelin, Mountain View, CA (US)

(73) Assignee: EM4, Inc., Bedford, MA (US)

( * ) Notice: Subject to any disclaimer, the term of this patent is extended or adjusted under 35 U.S.C. 154(b) by 124 days.

(21) Appl. No.: 10/424,006

(22) Filed: Apr. 25, 2003

Related U.S. Application Data (60) Provisional application No. 60/395,286, filed on Jul. 12, 2002.

(51) Int. Cl.
*H01L 29/76* (2006.01)
(52) U.S. Cl. .......................................... 96/132; 257/99
(58) Field of Classification Search ................. 257/99; 385/129; 96/132
See application file for complete search history.

(56) References Cited

U.S. PATENT DOCUMENTS

| | | | |
|---|---|---|---|
| 4,081,397 A | | 3/1978 | Booe |
| 4,272,259 A | * | 6/1981 | Patterson et al. ............... 95/95 |
| 5,223,783 A | * | 6/1993 | Wilis .......................... 324/71.5 |
| 5,630,855 A | * | 5/1997 | Lundb ack ..................... 96/405 |
| 5,696,785 A | | 12/1997 | Bartholomew et al. |
| 5,770,473 A | | 6/1998 | Hall et al. |
| 5,888,925 A | | 3/1999 | Smith et al. |
| 6,077,046 A | | 6/2000 | Kennedy et al. |
| 6,200,494 B1 | * | 3/2001 | Manini et al. ............ 252/181.7 |
| 6,203,869 B1 | | 3/2001 | Dougherty et al. |
| 6,398,980 B1 | | 6/2002 | Reutova et al. |
| 6,428,612 B1 | * | 8/2002 | McPhilmy et al. ............ 96/132 |
| 2002/0063323 A1 | | 5/2002 | Saito |

OTHER PUBLICATIONS

P. Schuessler & D. Feliciano Welpe (Oneida Research Services) The Effects of Hydrogen On Device Reliability, Hybrid Circuit Technology, Jan. 1991.

* cited by examiner

*Primary Examiner*—Edward Wojciechowicz
(74) *Attorney, Agent, or Firm*—Wilmer Cutler Pickering Hale and Dorr LLP (57) ABSTRACT

A getter and method for making is provided for removing unwanted impurities from the main body of a sealed hermetic enclosure or package containing one or more devices or objects that have sensitivity to contact with the impurity. The getter may be formulated from granular or powdered materials that react with gas-phase impurities through a combination of chemisorption and absorption mechanisms to form one or more stable species. A porous receptacle is included that contains the getter material such that it cannot penetrate into the main body of the sealed package while allowing the gases in the main body of the package, including the target impurities, to pass freely into the receptacle where they are subsequently rendered immobile by the action of the getter material.

26 Claims, 5 Drawing Sheets

Getter receptacle installed within package containing a device

Figure 2
Receptacle attached to sealing member

Figure 1A
Side view of receptacle cup containing getter material

Figure 1B
Top view of receptacle

Figure 3

Getter receptacle installed within package containing a device

Figure 4

Getter material retained in getter subvolume segmented from device subvolume by a partition

Figure 5

Getter material retained in getter subvolume/receptacle located within ta wall of the enclosure behind a partition/porous barrier

Figure 6

Getter material in package/enclosure with an external blister indicator

SYSTEM AND METHOD FOR GETTERING GAS-PHASE CONTAMINANTS WITHIN A SEALED ENCLOSURE

RELATED APPLICATIONS

This application claims priority to U.S. Provisional Patent Application Ser. No. 60/395,286, filed on Jul. 12, 2002, the disclosure of which is hereby rated by reference in its entirety.

FIELD OF THE INVENTION

This invention relates generally to the control of gas-phase or other airborne impurities or contaminants, and more specifically to methods and apparatus for removing gas-phase impurities or contaminants from the atmosphere of a sealed device enclosure such as for instance, a packaged device, in particular, an optoelectronic device that has sensitivity to moisture and hydrogen. Inclusion of a material with a mechanism to immobilize the impurity lessens failure and performance reduction issues associated with reactions of impurities and/or contaminants with the device. This material is enclosed separately from the device so that it may be exposed to the airborne impurities or contaminants without coming into contact or otherwise contaminating the device or main body of the package.

BACKGROUND OF THE INVENTION

Controlling or reducing the concentrations of gas-phase impurities, contaminants, or other undesirable materials through the use of chemical getters is widely practiced in a variety of industries, including silicon and compound semiconductor growth, photolithographic processing and optical fiber manufacturing, resulting in improved performance and yield. Analytical instrumentation applications include gas chromatography and moisture/oxygen analyzers. Another industry in which it can be important to remove impurities is in packaging of hermetically sealed electronic devices in which moisture, other gases, and/or particulates may cause issues with reliability, damage, and reduction of device lifetime. In general, a getter composition is placed in a volume containing one or more devices or objects that are susceptible to damage caused by contact with or exposure to one or more gas-phase or other airborne contaminants. The getter is typically a reactive solid material that either adsorbs, absorbs, chemisorbs, or catalyzes a reaction that immobilizes or destroys one or more targeted contaminant compounds.

Some examples of atmospheres and their potential gas phase contaminants include purge gases, compressed dried air (CDA), $N_2$, $O_2$, and mixtures with inert gases. These can be purified of contaminants such as $SO_2$, $SO_x$, $NO_x$, $H_2S$, $H_2O$, $CO_2$, hydrocarbons, siloxanes, ammonia, amines, and acid gases using metal oxide catalysts. Gas phase contaminants including $H_2O$, $H_2$, and $CO_2$ that occur in chlorinated, brominated, and fluorinated gases may be removed using impregnated or ion exchanged zeolite adsorbent materials. Hydrogen gases, inert gases and mixtures of the same that are contaminated with $H_2O$, $O_2$, CO, $CO_2$, and non-methane hydrocarbons can be purified using nickel silica and titanium catalysts, typically removing the contaminants through a combination of chemisorption, oxidative addition, and simple oxidation and adsorption.

One common application in which getters are frequently employed is optoelectronic and microelectronic devices. The use of dried air to enclose electronic packages has been standard practice for many years. In general, the air is specially dried so that the dew point of the internal atmosphere is well below the lowest storage or operational temperature of the package. However, when the package material is principally a plated metal, such as Kovar, it has been observed that over time, hydrogen evolved from the plating or the metal reacts with oxygen present in the internal atmosphere to produce water vapor. Another possible reaction path is through oxides present on the surfaces of the package or the device. In this case, the oxide is reduced and water vapor is released into the package. Given sufficient time, the amount of water vapor generated through either or both mechanisms can cause the internal atmosphere dew point to exceed the operational or storage temperature, whereupon the water vapor condenses to liquid form. Reduction of solid oxides may lead to an impairment of the device performance by altering the electrical or optical characteristics. Condensation of water can lead to contamination, corrosion, and other types of chemical and/or physical damage. Hydrogen may be present in the enclosure atmosphere as an impurity or contaminant in the gas used to fill the enclosure or it may outgas from the walls of a metal enclosure over time or as the temperature increases. Many microelectronic and optoelectronic devices are sensitive to moisture with consequent effects on reliability due to corrosion or other alteration of contact materials. Heating and cooling may compound the problem. Metal migration can occur when there is a potential difference between two adjacent conductors, in the presence of moisture and ionic contaminants. Biased ions are carried via the moisture to migrate the conductor from a lower to a higher potential conductor, thereby forming a short-circuit between the conductors. Formations such as dendritic growth and metal whiskers can occur, with detrimental effects on device functioning. Corrosion occurs when a contaminant behaves as a catalyst with water to oxidize metallization and continues until all of the available water is consumed, generally resulting in device failure.

In addition to the aforementioned problems that may be caused by water formation from reactions of oxygen with hydrogen, enclosures that include ferrous alloys and other metallic materials such as, for example, gallium arsenide are particularly sensitive to damage due to hydride formation. Metal hydrides are gradually oxidized, which may result in device failures in both silicon and gallium arsenide devices. For example, hydrogen gas concentrations as low as 0.5% of ambient atmosphere have been shown to cause significant degradation in a relatively short time (168 hours) at elevated temperatures of 125° C. in GaAs field effect transistors (FETs) and microwave monolithic integrated circuits (MMICs). Investigators have proposed that the mechanism for device damage includes catalytic conversion of the molecular hydrogen by platinum at the gate, resulting in atomic hydrogen diffusing into the semiconductor, compensating the silicon dopant donors and reducing the current and gain of the device. Considerable attention has been given to the issues surrounding the degrading effects of hydrogen on a range of GaAs microelectronic device technologies. The potential for device damage is also of concern for optoelectronic technologies. Many optoelectronic devices are fabricated using similar techniques to those in GaAs microelectronics. Thus the deleterious effects of hydrogen can be two-fold. Hydrogen "poisoning" can change the structure of the semiconductor itself, and the evolved hydrogen may react with oxygen to form water resulting in an overall reduction in the oxygen levels within the enclosure and the consequent effects of moisture as described previously. Coatings or films on optical surfaces may be negatively affected or degraded as well.

A device that is packaged in a controlled atmosphere with minimal levels of either moisture or hydrogen will not necessarily be permanently immune to the aforementioned effects. A significant contribution may be made over time by outgassing from the packaging materials. In addition, a perfect hermetic seal is not practically achievable. An enclosure with a measured helium "leak-rate" of no more than $10^{-8}$ mbar L s$^{-1}$ is typically defined as being hermetically sealed. The resulting concentrations of contaminant gases in a sealed enclosure vary and, in general, increase over time. Residual gas analysis (RGA) studies on sealed empty ferrous alloy packages have demonstrated evolution of significant amounts of moisture and hydrogen over a period of 1000 hours at a temperature of 125° C. Initially, it was theorized that the source of the hydrogen was the plating processes that may have entrapped hydrogen molecules within the plated metals that subsequently diffused from the plating with thermal stress. However, later research showed that there is an additional mechanism associated with the base alloys. Test results showed that these alloys typically contain small (on the order of approximately 0.5 ppm$_w$ or parts per million by weight) amounts of hydrogen. However, when these hydrogen contents are recalculated to an equivalent gas phase concentration in the volume of a sealed enclosure, the result is an extremely high level of hydrogen (on the order of approximately 17,000 ppm$_v$ or parts per million by volume) that may be desorbed into the enclosure. The importance of hydrogen desorption increases as the volume of a sealed enclosure decreases because the surface area to volume ratio of an enclosed volume increases as its volume decreases. Desorption occurs continuously because of diffusion paths in the base alloy and cannot necessarily be blocked.

One way of mitigating the effects of hydrogen in a ferrous alloy cavity package is to anneal the package prior to sealing at a higher temperature than that at which it will be operated, such that hydrogen is desorbed over a period of time before the device is installed and the package sealed. This type of bake-out procedure can effectively reduce the quantity of hydrogen that is available for desorption at a lower temperature during the operating lifetime of the device. When used in combination with a method of gettering any remaining hydrogen within the sealed package during that lifetime, the gas-phase hydrogen concentration can be effectively reduced to approximately zero.

A number of methods and systems have been described in the prior art to reduce gaseous hydrogen desorbed within the package. Some employ metal alloys that react with hydrogen to form metallic hydrides. Many of these getters require high operating temperatures to promote quantitative conversion of hydrogen. One approach described in U.S. Pat. No. 5,888,925 to Smith et al. utilizes palladium oxide combined with a Zeolite desiccant held together using a binder such as RTV silicone to provide a catalyst that reacts hydrogen to water which is subsequently adsorbed and contained to remove free hydrogen from the sealed atmosphere. Although this system is capable of operating at low temperature, it has several potential weaknesses. The zeolite desiccant has a substantially reduced sorption capacity for water at higher temperatures—up to 70% of the capacity is effectively lost at temperatures greater than 100° C. Thus, trapped water may be liberated within the enclosure at higher operating temperatures. This substantially diminishes the protective effect. Problems associated with this physical mechanism may be reduced by increasing the overall quantity of adsorbent material. However this temperature-reversible effect is undesirable in general. Additionally, the bulk of the added getter material required to protect against release of trapped water at elevated temperatures necessitates use of greater volume within the sealed enclosure to provide the needed protection capacity. Two other prior art getters disclosed in U.S. Pat. No. 5,696,785 to Bartholomew et al and U.S. Pat. No. 6,200,494 to Manini et al use a combination of adsorbent materials, bound with a plasticizer. U.S. Pat. No. 4,081,397 to Booe discloses a similar getter device in which irreversible alkali oxide desiccants are bound into an elastomeric material. All of these prior art getters suffer from the introduction of organic materials, such as would be used for the binder, into the sealed cavity. Organic compounds are a particular concern in the packaging of optoelectronic devices, due to contamination of the optical surfaces and consequential impairment to operation.

SUMMARY OF THE INVENTION

The present invention provides a solution for problems associated with the inclusion of undesirable materials inside a sealed enclosure. Inclusion of a powdered or granular getter material within a sealed enclosure is simplified such that the powdered material is available to react with gas-phase contaminants in the main volume of the enclosure but is restricted from contacting potentially sensitive devices or objects within the main body.

In one embodiment of the present invention a gettering system is provided. The gettering system comprises a sealed enclosure defining a first volume and a receptacle enclosing a second volume. The second volume communicates with the first volume through a partition through which one or more contaminants may diffuse from the first volume to the second volume. A gettering material is contained in the second volume. The gettering material has a physical form that precludes the gettering material from passing through said partition to said first volume. The gettering material acts to immobilize the contaminants that diffuse into the second volume.

In an alternative embodiment, a gettering system for removing a gas-phase contaminant compound from the atmosphere of a sealed enclosure containing a device is provided. The system comprises a powdered and/or granular getter composition comprising a chemical that reacts with a gas-phase contaminant to form an immobile compound, thereby removing the contaminant from the gas phase. A partition is provided that separates the volume of the sealed enclosure into a getter volume and a main volume. The main volume houses the device while the getter volume houses a measured quantity of the getter composition. The partition has a porous section through which the one or more contaminants may diffuse but through which the getter composition may not pass.

In another embodiment of the present invention, a method of making a gettering system according to one of the above embodiments is provided. A getter composition is selected from the group consisting of alkali metal oxides, alkali metal chlorides, alkali metal hydrides, alkali metal hydroxides, metal halides, metal sulfates, metal perchlorates, noble metals, metal oxides, carbon, metal aluminosilicates, silicates and silica material. This getter composition is placed in the getter volume under a dry atmosphere, and the enclosure is sealed under a dry atmosphere.

In yet another embodiment of the present invention, a method of gettering contaminants from an atmosphere enclosed within a volume defined by a sealed package is provided. The method comprises the step of dividing the volume into a getter subvolume and a device subvolume with a partition. The partition is permeable to gas-phase molecules but not solid particles. Contaminant molecules that permeate through the partition into the getter subvolume are immobilized by a getter material. The getter material is a powdered and/or granular solid with a particle size that precludes passage of the getter material through the partition into the device subvolume.

In an alternative embodiment according to the present invention, a method is provided for protecting a device in a sealed enclosure from contaminants that diffuse or leak into the enclosure. The enclosure is divided into a getter subvolume and a device subvolume with a partition that is permeable to gas-phase molecules but not to solid particles. The device is housed in the device subvolume. Contaminant molecules that permeate through the partition into the getter subvolume are immobilized with a getter material. The getter material is a powdered and/or granular solid with a particle size that precludes passage of the getter material through the partition into the device subvolume. Both the original getter material and its reaction products are stable in that they do not provide any potential contamination issues themselves.

BRIEF DESCRIPTION OF THE DRAWINGS

The following drawings are included to simplify understanding of the detailed description of the invention. However, they are provided for the purpose of illustration only. Although the figures and the detailed description relating to them refer to exemplary embodiments, the present invention is not in any way limited to the precise format and arrangement described and shown herein. The present invention may be better understood through reference to the following drawings, wherein.

DETAILED DESCRIPTION OF EMBODIMENTS OF THE INVENTION

The background description presented above applies most specifically to the use of getters in optoelectronic and microelectronic devices. However, the foregoing descriptions of the invention encompass a much broader range of potential applications. The present invention addresses problems associated with the inclusion of undesirable contaminants or impurities inside a sealed enclosure. In the ensuing description, impurities and contaminants are used interchangeably to generally describe undesirable substances including, but not limited to gas or vapor phase compounds or other airborne materials that may deposit upon one or more surfaces of a device or device component with detrimental results to function or longevity of the device or component.

In the present invention, a method and system are provided to simplify the inclusion of a getter material that is understood to behave in a desired manner when combined with gas-phase contaminants including, but not limited to hydrogen and water, under a broader range of environmental conditions than the enclosure is likely to encounter under normal operating conditions. The specific exemplary getter embodiments described herein are targeted for removal of hydrogen and water for the gas-phase inside a sealed enclosure. However, one of ordinary skill in the art should readily be able to apply these teachings to produce getters targeted for other contaminants that include the advantages of the present invention. In an illustrative example of a getter for hydrogen and water, a getter material is selected to perform one or more of five basic functions: 1) catalyze hydrogen to a hydride with consequent water production, 2) react to immobilize water to form a stable hydroxide by chemisorption, 3) remove additional unwanted impurities from the sealed package by various other mechanisms, 4) operate at elevated temperatures, and 5) retain previously adsorbed/reacted impurities even at elevated temperatures. In at least one embodiment, all five functions are provided. The method by which the getter material is mounted provides both containment of the powdered getter material away from the device or object to be protected and access of gas-phase, vapor phase, or other airborne contaminant species from outside of the getter chamber to within the getter chamber. Quantities of getter material and the physical dimensions of its container are designed as appropriate for the conditions, which depend on the specific materials used in device packaging, their outgassing qualities, the environmental conditions to which the package is subjected to in pre-processing, and the expected conditions after packaging—during the device operating lifetime.

In one embodiment, the present invention provides a system and method for gettering undesirable contaminants from the atmosphere of a sealed container. In general, a combination of one or more powdered or granular getter materials is housed within a receptacle or behind a partition inside a sealed enclosure. The receptacle or partition is permeable to the gases and vapors within the main body of the cavity. However, the getter material or materials cannot penetrate into the main volume of the enclosure which may house one or more devices or objects that are susceptible to damage through exposure to gas-phase contaminants. The receptacle or partition is porous along at least a part of one of its surfaces such that molecules of the gas-phase contaminant species to be removed from the atmosphere of the enclosure may pass through it to contact the getter material but getter particles may not pass through it to enter the main volume of the enclosure and interact with the devices or objects therein.

Figure 1A:
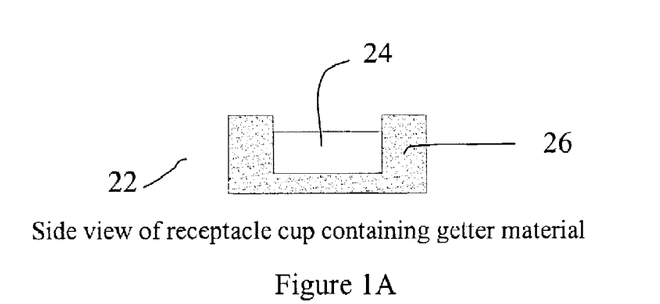
FIGS. 1A and 1B are schematic diagrams showing a side cross section and a top view, respectively, of an example of a receptacle that can be used to contain getter material according to one embodiment of the present invention.
Figure 1B:
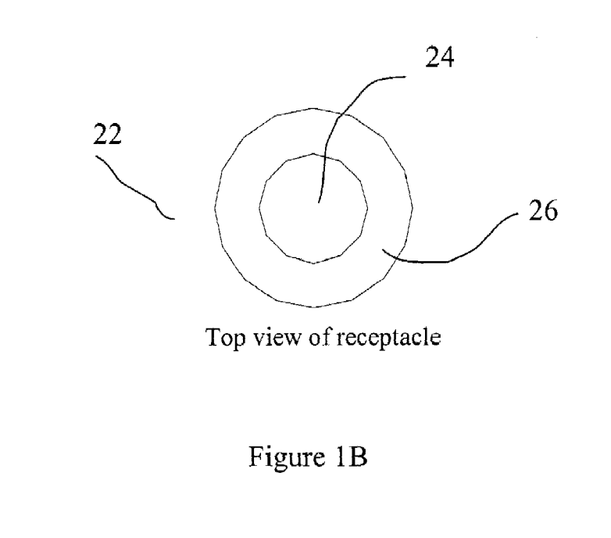
Figure 2:
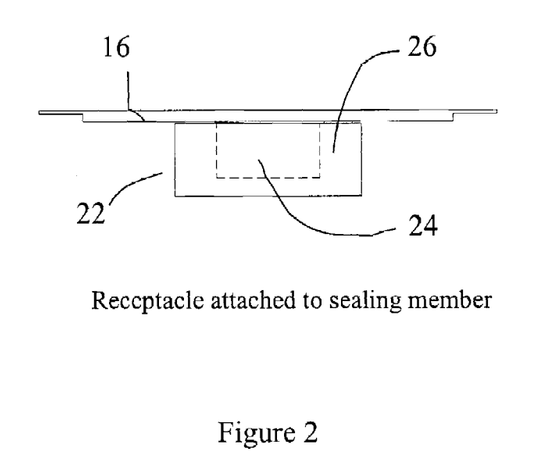
FIG. 2 is a schematic diagram showing a side-view of the arrangement of a receptacle and enclosed getter material after it has been sealed to retain the getter material inside the receptacle.
Figure 3:
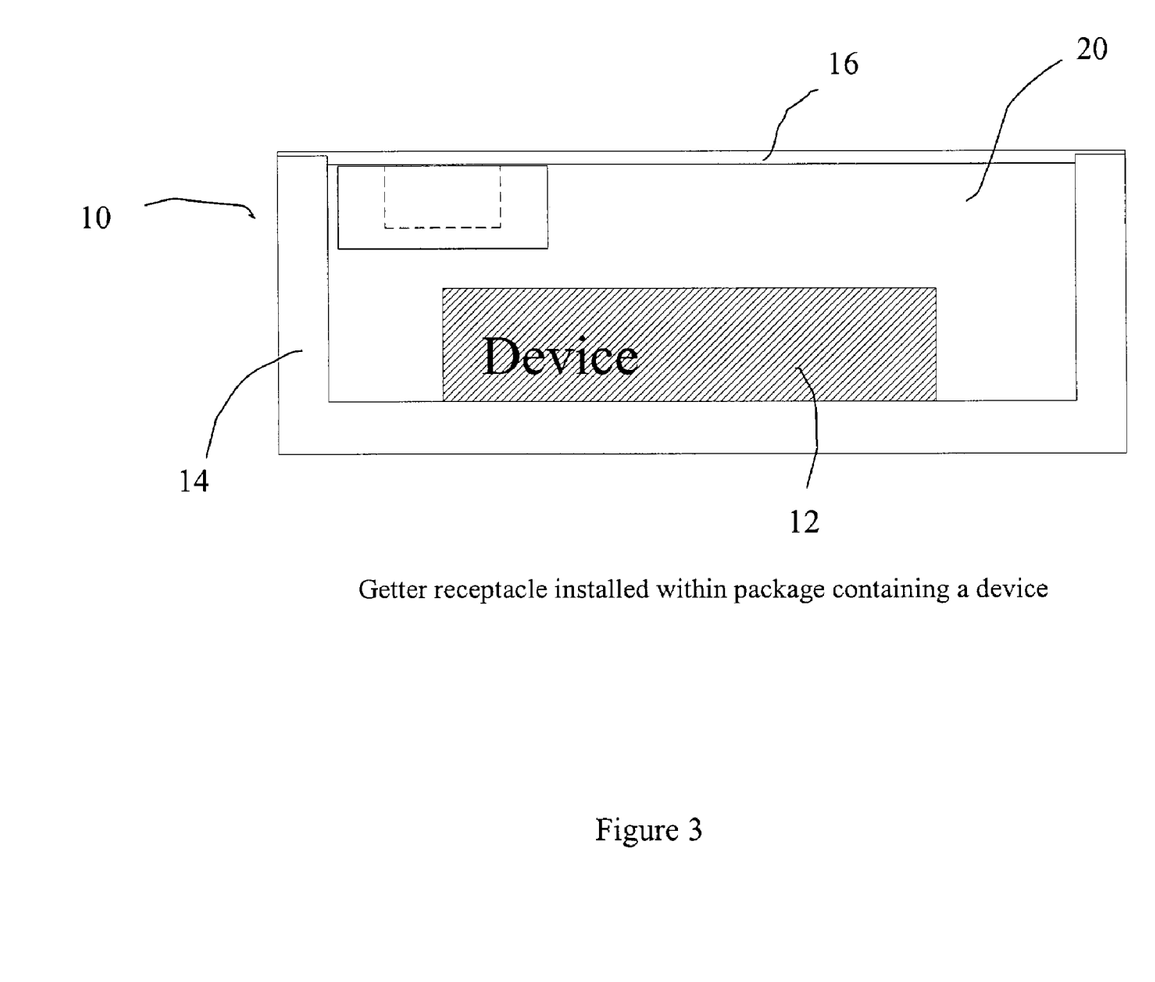
FIG. 3 is a schematic diagram showing a sealed getter and receptacle mounted into a sealed cavity that also contains an impurity or contaminant-sensitive device according to one embodiment of the present invention.

In one embodiment of the present invention illustrated in FIGS. 1, 2, and 3, an enclosure 10 is provided. The enclosure contains a device 12 and may have one or more walls 14 and a lid 16 that combines with the walls 14 to form a sealed main volume 20. Also provided within the main volume 20 is a getter receptacle 22 which encloses an inner getter volume 24. The receptacle may be made of metal that has been fabricated so that some proportion of its area or the lid 16 is made using a method of sintering of powdered metal. Porous ceramic or other comparable materials may alternatively be used. In one example, the receptacle is a porous sintered cup that has an opening inside which the getter material is contained. One or more of the surfaces of the receptacle 22 is open such that the receptacle may be filled and subsequently sealed. FIGS. 1A and 1B show one example of a receptacle 22 according to this embodiment. The pictured receptacle 22 in this example is approximately right cylindrical in shape and comprises a cylinder-shaped cup body 26 formed of a porous material that encloses a getter volume 24 containing a powdered getter composition. However, the shape of the getter is not in any way limited to a cylinder. Any shape of receptacle that encloses a getter volume 14 separated from the main volume 20 by an at least partially porous divider or some other partition such as a membrane or screen or grid that permits passage of airborne contaminant molecules while restricting the movement of the getter material through the partition is envisioned. The porosity of the cup body 26 in the present embodiment is sufficiently high that molecules of the contaminant of interest can readily diffuse through the body from the main volume 20 to the getter volume 24, but sufficiently low that getter particles cannot pass from the getter volume 24 to the main volume 20. The average pore size of the partition may be in the range of approximately 0.1 to 200 microns, depending on the granular size of the getter material, which may range from a few tenths of microns to several millimeters or more. Alternatively, the getter material average pore size ranges from approximately 0.3 microns to approximately 3 millimeters. The choice of the size of the getter material particles and the average pore size and/or porosity of the partition may be selected by one of skill in the art based on the teachings provided herein such that the getter material is restricted from entering the main volume 20.

The material of the receptacle 22 may or may not be selected to match the thermal expansion properties of the sealing material, based on the demands of the environmental conditions that it will encounter in the device lifetime. However, it is desirable to select the materials so that an adequate seal exists under all of those conditions. In a one embodiment, the receptacle is formed of a sintered material selected to match the thermal expansion of the sealing lid (which is not porous in this particular case) and is pre-treated so that the subsequent sealing method used can be carried out at relatively low temperature (300° C.). This material may be sintered metal such as, for instance Kovar alloy, nickel, ferrous alloys, and the like. Alternatively, the receptacle and the device enclosure may be constructed of any appropriate material that is stable over the expected range of operating conditions and that may be formed into an airtight enclosure.

After getter material is placed inside the getter volume 24 of the receptacle 22 the getter volume may be closed by either affixing the cup body to the lid 16 or by affixing a sealing plate (not shown) other than the lid 16 to the edges of the cup body 26. The receptacle may be sealed using either porous or non-porous material. In one example, a lid that may be in the form of a flat plate, which may or may not be the sealing plate for the main body of the cavity, is used to close the receptacle. The method of sealing should be such that there may be no penetration of the getter material into the main body of the cavity, however the seal of the receptacle itself need not be air-tight or hermetic because the receptacle itself is intended to be permeable to gas molecules.

In a more specific, illustrative embodiment, a ferrous alloy cup body 26 that is fabricated to provide an average pore size of approximately 0.2 μm throughout the material volume is used to contain the getter material. The approximate dimensions of the cup/receptacle 22 are 5 mm outer diameter, 2.5 mm inner diameter, 2 mm outer depth, and 1.75 mm inner depth, such that a volume of greater than approximately 8.5 mm$^3$ is available within the cup body 26. The cup body 26 is pre-tinned with a gold-tin solder and then the getter material is inserted in the getter volume 24 within the receptacle 22 while in a dry-box environment. The getter material is pre-mixed, and comprises CaO with 2 wt % PdO. Approximately 20 mg total of this getter composition is used, allowing for a factor of 1.6 volume increase to be accommodated within the cavity. This quantity is adequate to remove greater than 2 mg of $H_2O$ from the main body of the enclosure, equivalent in this case to more than 1,000,000 $ppm_v$ for the approximately 1.35 cm$^3$ volume of the enclosure. The porous cup body 26 is subsequently attached to the lid 16 of the enclosure using a vacuum solder reflow process. In this embodiment, the lid 16 is also then sealed to the remaining walls 14 of the enclosure 10 to seal and enclose the main volume 20. The method of sealing the enclosure 10 using an elevated temperature solder seal provides post-seal shear strengths of greater than 3,000 psi both prior to and subsequent to thermal cycling between approximately −40° C. to 100° C. over approximately 250 cycles. A range of other seal methods and enclosure and getter receptacle shapes and configurations are possible and may be selected by one of ordinary skill in the art as appropriate to the manufacturing process capabilities and required specifications of the device based on the teachings of the present invention. These additional sealing methods include, but are not limited to, electromechanical thermal sealing or welding, mechanical crimping processes, a press-fitting plug, and/or some form of mechanical retainer that holds the receptacle and sealing plate to form a single physical entity.

Although the presented embodiments of the receptacle and sealing plate and device enclosure/package are of the form of a metal, or combination of metal alloy, this invention is not limited to metallic materials and may also be carried out using some other form of inorganic material that allows for some porosity as part of its construction. This may be a material such as silica in the form of glass or alumina in the form of ceramic, both of which may be fabricated into porous forms enclosing a getter volume 24 that can contain a powdered getter material and allow passage of gas-phase molecules while preventing migration of the getter powder in the main volume 24 of an enclosure. In addition, materials that may contain some organic constituents may be found useful in some applications, such as plastics or organometallic materials. These differing materials may be selected by one of ordinary skill in the art based on the teachings of the present invention in accordance with the overall requirements of the device.

Figure 4:
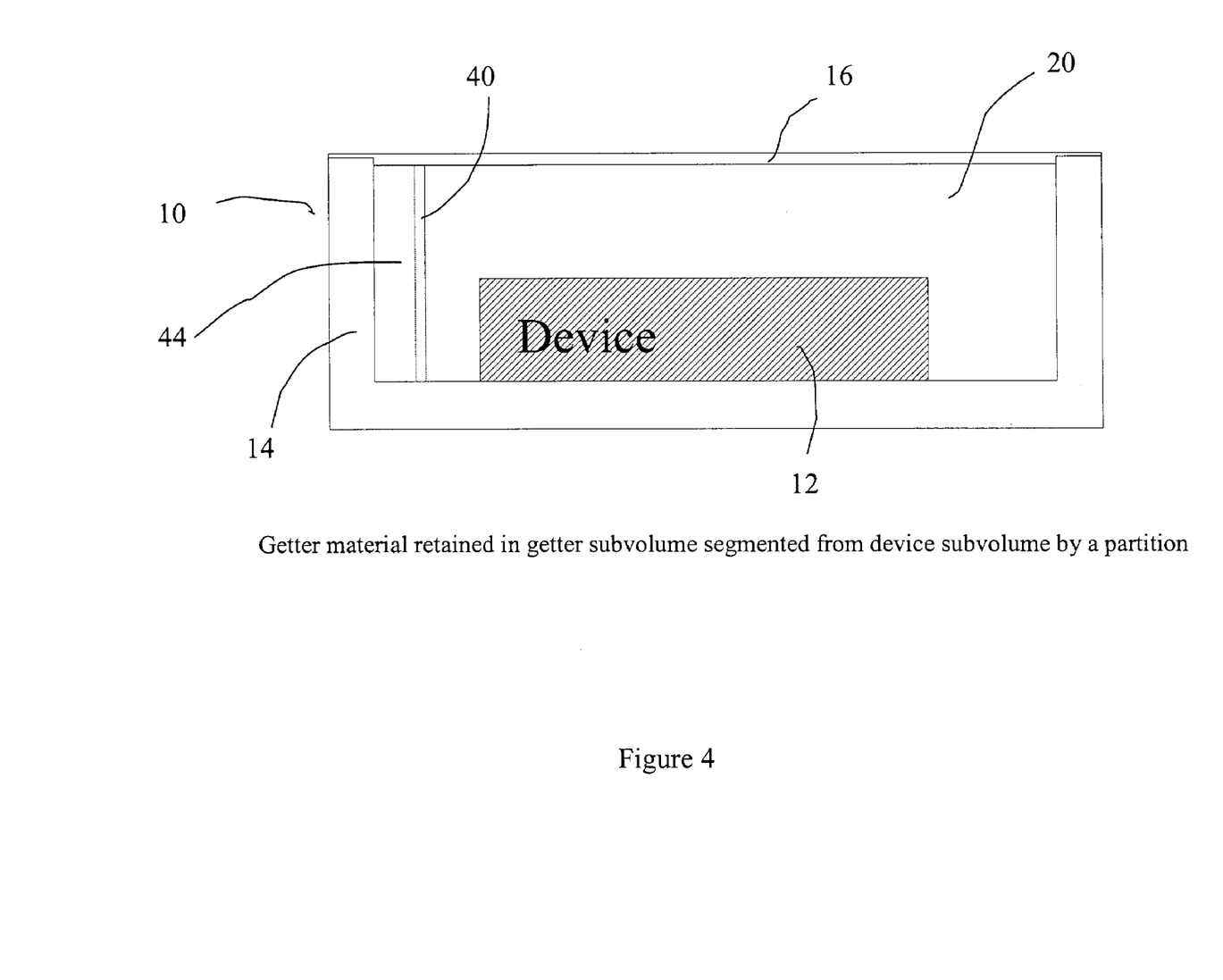
FIG. 4 is a schematic diagram of a segmented sealed enclosure configuration including porous barrier between a getter receptacle and a device according to one embodiment of the present invention.
Figure 5:
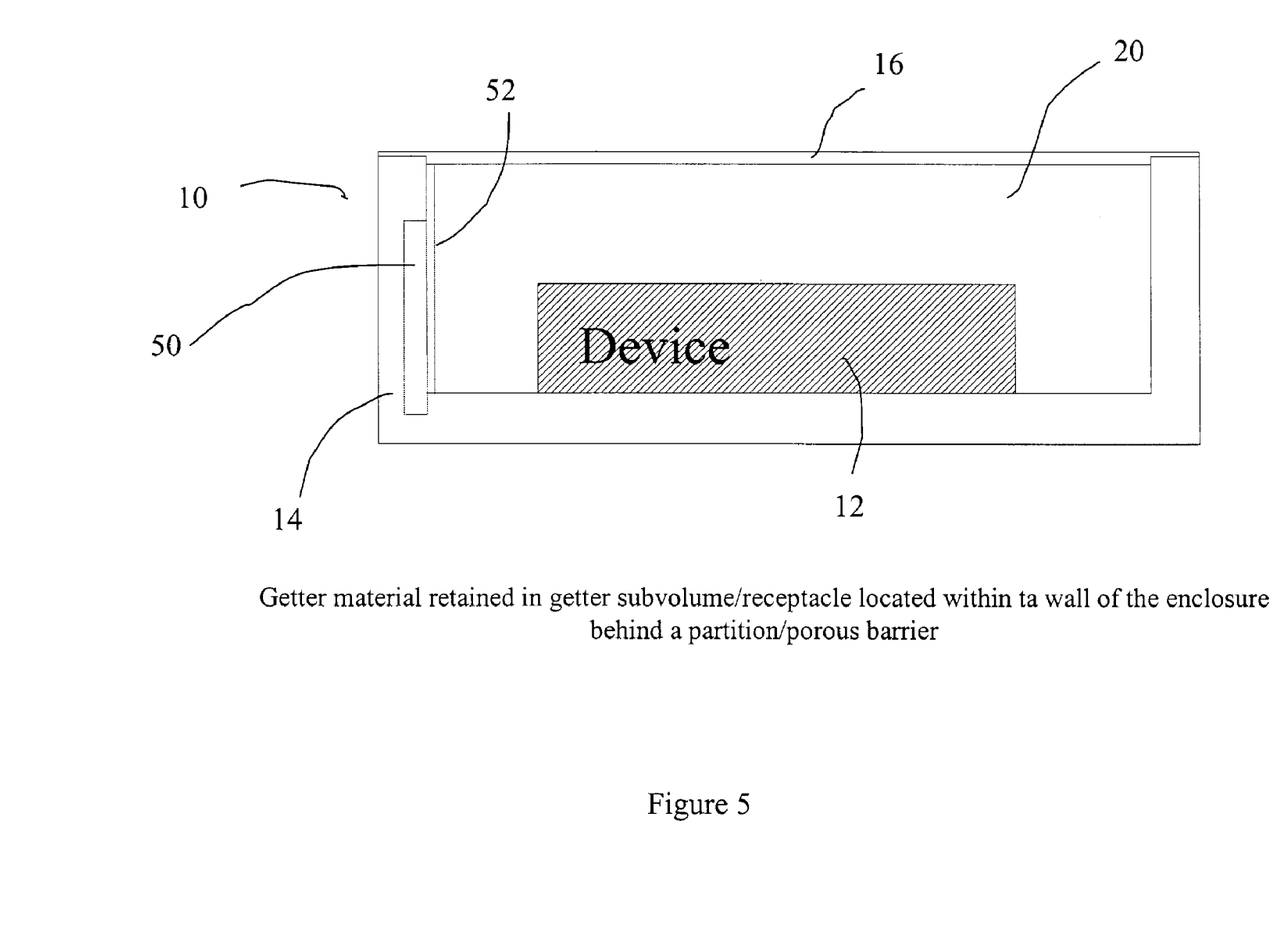
FIG. 5 is a schematic diagram of a scaled enclosure including a getter receptacle incorporated as part of the external package and a porous barrier between the receptacle and the main body of the enclosure according to one embodiment of the present invention.

Two alternative embodiments of the getter receptacle are illustrated schematically in FIGS. 4 and 5. In FIG. 4, the enclosure 10 is similar to that depicted in FIG. 3 with the exception that the getter receptacle cup body 26 is not present. Instead, a porous partition 40 is provided to divide the main volume 20 enclosing the device 12 from a getter volume 44 containing the powdered getter material. At least some of the porous partition's surface area is comprised of a porous material with a porosity preferably in the range of approximately less than 0.1 to 200 microns. The enclosure is prepared by filling the getter volume 44 with sufficient powdered getter material under a dry, clean atmosphere prior to sealing the enclosure with the lid 16. Gas-phase contaminants in the first volume 42 diffuse through the porous area of the porous partition 40 to react with the powdered getter material in the getter volume 44.

In the embodiment depicted in FIG. 5, a getter receptacle volume 50 is formed in one of the walls 14 of the enclosure 10. The getter receptacle volume 50 is separated from the main volume 20 which contains a device 12 by a partition 52 that comprises at least an area of porous surface area through which gas-phase contaminant molecules may diffuse from the main volume 20 to the getter volume 50. The getter volume 50 is filled with powdered getter material under a dry, clean atmosphere and then separated from the main volume by the partition 52. Then the enclosure 10 is sealed by attachment of the lid 16.

One embodiment of the getter material itself for use in conjunction with the above described embodiments of the device enclosure and receptacle for controlling hydrogen, water, and carbon dioxide in a sealed enclosure is a combination of an alkali metal oxide material and a noble metal oxide. This composition may be combined with a sorbent such as for example powdered or granular activated carbon, zeolite, or charcoal in some proportion to provide a gettering material with a significant sorption capacity for organic impurities that may be present in the main volume of the sealed cavity. Granular size may be selected as appropriate to the porosity levels of the receptacle as well as the desiccation needs of the device and is preferably within the range of approximately a micron or less to greater than several hundred microns.

In one specific embodiment, the noble metal oxide is anhydrous palladium (II) oxide (Alfa Aesar #11040), which reacts with gas-phase hydrogen to form a hydride of palladium and water according to the reaction:

$$PdO + H_2 \rightarrow Pd + H_2O \quad (1)$$

The resulting water then reacts by chemisorption with the alkali oxide material, which in this example is anhydrous calcium oxide (Sigma-Aldrich #45,171-1), resulting in a hydroxide as follows:

$$CaO + H_2O \rightarrow Ca(OH)_2 \quad (2)$$

Or similarly, anhydrous barium oxide (Sigma Aldrich #11462) may be used to form a hydroxide with water as follows:

$$BaO + H_2O \rightarrow Ba(OH)_2 \quad (3)$$

The products in reactions 2 and 3 are irreversible up to at least approximately 500° C. Another reaction that occurs in the presence of calcium oxide and gas-phase carbon dioxide is $$CaO + CO_2 \rightarrow CaCO_3 \quad (4)$$

Thus, in the example of CaO combined with PdO, gas-phase contaminants $H_2$, $CO_2$, and $H_2O$ that are either initially present in the main volume of an enclosure or that enter the gas-phase within the volume wither through leaks in the enclosure envelope or by desorption from the walls are converted to one or more stable, non-gas-phase materials and effectively immobilized on contact with the getter material after diffusing through the pores of the receptacle from within the main body of the sealed cavity.

Various other chemical substances that may be appropriate for drying in combination or alone as some other embodiment of this invention include but are not limited to other oxides such as barium oxide, boron oxide, aluminum oxide, magnesium oxide and other alkali metal oxides, chlorides or hydrides such as calcium chloride, calcium hydride and lithium aluminum hydride and a number of other chemical or physical drying agents containing hydroxides, metal halides, sulfates, perchlorates, noble metals, metal oxides, carbon, metal aluminosilicates, silicates, and/or silica material. The drying agent effectiveness may be improved by using materials of an anhydrous nature but substances that are not necessarily specified as anhydrous may be adequate, depending on the exact nature of the environment from which the impurities are to be removed.

For the purposes of removal of volatile organic compounds from the main body of the sealed cavity, one type of particularly effective absorbent material is activated charcoal that is graded as extra pure, with low ash content, such as Darco-G60, (Aldrich Catalog #24,227-6). However, the choice of material is not limited in this respect, based on the requirements of the device. This material may preferably be combined with the alkali and noble metal oxide powders discussed above in proportions and quantities appropriate to the needs of the device and the expected impurity levels, which could be estimated by one skilled in the art based on the teachings herein and on an analysis technique such as residual gas analysis (RGA).

In another embodiment, a quantity of getter material comprising calcium oxide combined with 2 wt % of palladium oxide which is adequate to immobilize greater than 800,000 $ppm_v$ of $H_2O$ over the lifetime of the device is used. This amount is considered to be sufficient for the purpose of dealing with any outgassed water from the particular packaging materials and any outgassed hydrogen that is subsequently converted to water through either catalysis with the palladium in the getter combination or through a thermally initiated conversion with oxygen. In addition, there is sufficient capacity to assuage the cumulative effect of the finite leak rate of the hermetically sealed package over the lifetime of the device. Use of this combination with the device packaging that this embodiment is designed for use in thereby retains the package moisture level to well within the limit of 5,000 $ppm_v$ as defined by the Military Standard 1081 specification (incorporated herein by reference), which has been used by the microelectronics industry as a pass/fail test for water vapor content of sealed packages. The specification of 5000 $ppm_v$ limit on moisture corresponds to −2.37° C. dew point. At atmospheric pressure, liquid condensation does not occur at any operating temperature above the dewpoint.

The mechanism that results in expansion or "swelling" of the getter material from the chemisorption process may further be utilized as a signal visible from outside of the main body of the enclosure that indicates a change in the physical environment inside the enclosure. Swelling of the getter material as it absorbs water and/or other contaminants may be utilized to advantage such that an external visual inspection of the package is sufficient to ascertain whether there has been a substantial leak during the lifetime of the device. Leakage may not necessarily mean device failure. However there may be reliability issues associated with that factor and this kind of external indicator could be used as part of routine maintenance to determine that device replacement is appropriate.

Figure 6:
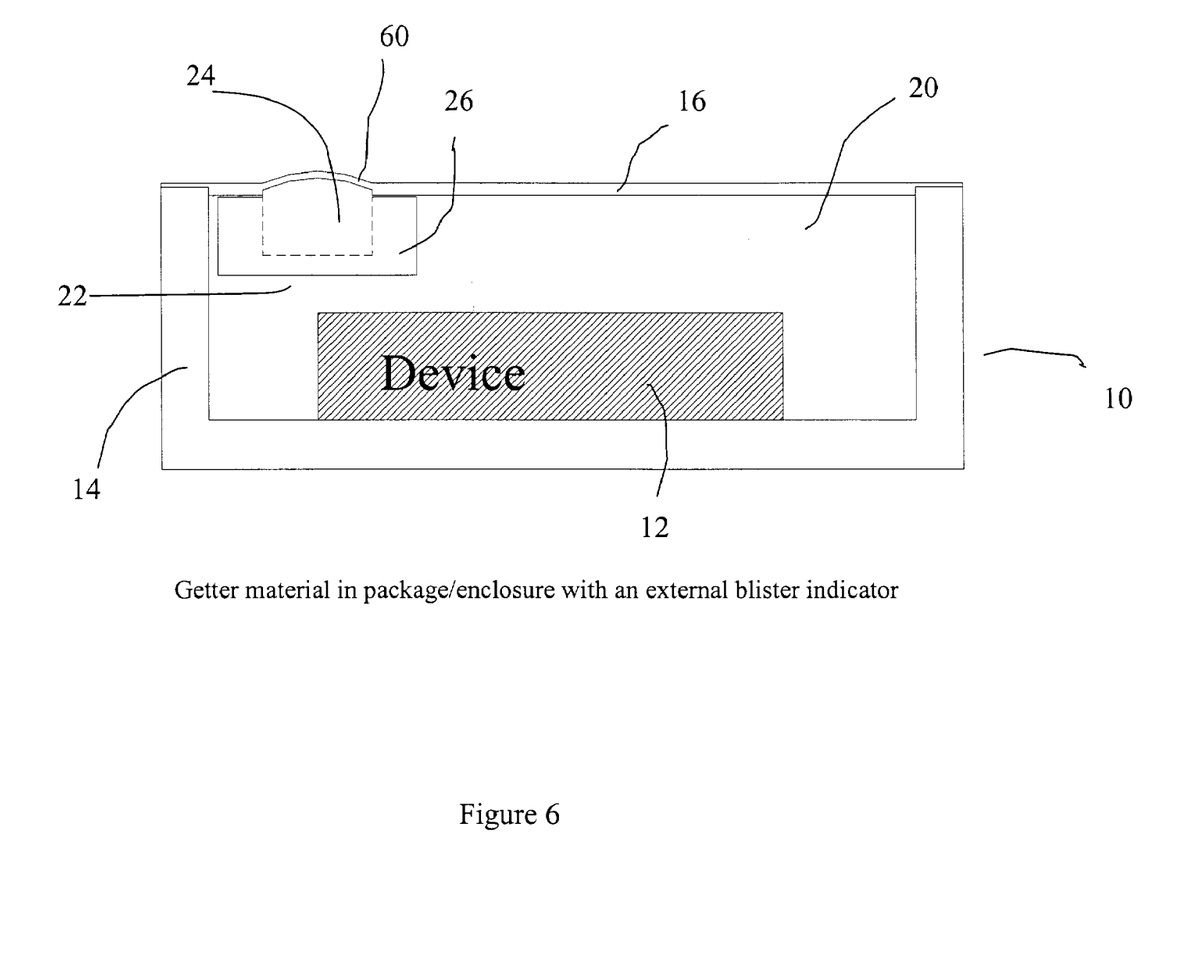
FIG. 6 is a schematic diagram showing a sealed getter receptacle designed to cause a blister to form in the outer wall of a sealed enclosure as a visible indicator of possible seal failure according to one embodiment of the present invention.

An example of this embodiment of the present invention is shown schematically in FIG. 6 which shows an enclosure 10 similar to the embodiment depicted in FIG. 3 and comprising walls 14 and a lid 16 enclosing a main volume 20 in which rests a device 12. A getter receptacle 22 as in FIG. 3 is included. The receptacle 22 comprises a cup body 26 constructed at least partially of a porous material that encloses a getter volume 24 containing one or more powdered getter materials. A non-porous surface 60 of the receptacle 22 comprises part of the external body of the main cavity. As shown in FIG. 6, this surface 60 forms part of the lid 16. However, one skilled in the art may see that the invention may also be implemented such that surface 60 is part of any of the outer walls of the enclosure 10. The wall thickness of the non-porous surface 60 is reduced relative to the other outer wall 14 lid 16 surfaces of the enclosure 10, or it is preferably fabricated from a different non-porous but compliant material. The receptacle is packed with powdered or granular getter material as described above to a level such that the decrease in getter density that occurs during the aforementioned chemisorption processes which remove gas-phase contaminants causes the getter to expand, thereby forcing the compliant area of the non-porous surface 60 to blister outward such that a deflection relative to the other outer surfaces of the enclosure is observable from the outside of the package body.

For the example of a CaO-based chemisorbing fraction of a getter powder composition, reaction of water vapor with the CaO forms $Ca(OH)_2$ as shown in reaction 2. This reaction is accompanied by a decrease in material density from approximately 3.34 g/cm$^3$ to 2.24 g/cm$^3$, resulting in an increase to nearly approximately 150% of the original volume of the CaO. Correct design of the receptacle volume/surface area and quantity of getter powdered placed in the receptacle may be made to force this additional volume requirement to be provided by outward deformation of the compliant non-porous surface 60 which results in formation of a "blister" on the outer surface of the enclosure that is observable from the outside. In one approach to providing the needed compliant area, the thickness of an area of the non-porous metal surface is reduced either by machining or by a etch process. This reduction in material thickness may be to a thickness less than approximately 0.005". Thicker non-porous surfaces are envisioned for getter enclosure embodiments in which the non-porous surface 60 covers a larger area and more getter material is included. One of ordinary skill in the art should readily be able to design such an enclosure based on known expansion factors for the getter material and on the known deformation resistance and/or shear strength of the chose material for the device enclosure, receptacle, and non-porous surface 60. Depending on other design factors of the enclosure and the device the thickness and area of the non-porous surface 60 should adequate to allow observable visibly detectable external distortion to an originally approximately flat and/or non-deformed surface area once the expansion of the getter material occurs.

Theoretical and Experimental Examples

The gettering capacity required for a given package or other enclosure into which gas-phase contaminants may diffuse or leak may be estimated based on the outgassing properties of the components and devices being housed within the package in addition to an estimate of the quantity of evolved $H_2O$ from the $H_2$ outgassing from the package material. Table I shows the calculated capacity required for a getter assembly used in various packages. It can be seen that the reduction in package volume requires that the proportion of that volume taken up by the getter assembly increases due to the effective increase in ppm$_v$ of hydrogen ($H_2$) desorbed by the package walls for a ferrous material. Even if that ferrous package is replaced by some other non-hydrogen desorbing material one or more other factors may account for potential sources of contaminant, such as, for example, an increased leak-rate at the package seal. Clearly, this may be an issue for plastic packages in which it is not as convenient to create a lid seal using a weld process. Calculations based on the measured leak-rates may be used to ensure that the getter has sufficient capacity over the lifetime of the device.

In the example case of a hermetically sealed package, the quantity of hydrogen outgassed into the cavity by the ferrous material from which the package is fabricated may be calculated to provide a "worst-case" estimate of moisture contamination of the cavity. The following example calculations correspond to a rectangular Kovar package of dimensions: width a, depth b and height c. The base and side walls have thickness t1 and the lid has thickness t2. Depending on the pre-processing, the package material will contribute a quantity of hydrogen (in µg/gram or ppm$_w$). For a standard process, low-hydrogen Kovar may be expected to contribute approximately 0.5 ppm$_w$ based on previously published experimental data [P. Schuessler & D. Feliciano Welpe (Oneida Research Services) *The Effects of Hydrogen On Device Reliability*, Hybrid Circuit Technology, January 1991]. In a simplest representation in terms of geometry, half of the hydrogen in the package material will diffuse into the cavity and half will diffuse out of the cavity. In the worst case, all of the hydrogen in the package material may be assumed to diffuse into the internal package cavity. The worst case circumstances are unlikely to occur in practice. However if there is a hydrogen sink within the cavity, as is the case when using a hydrogen getter and/or the hydrogen is transformed into water, hydrogen in the package material will continue to diffuse into the lower concentration region over time and thus the quantity cannot be estimated in terms of a simple fraction. Based on these assumptions, it is reasonable to estimate that some quantity greater than half of the hydrogen contained in the original material will end up in the cavity. The volume of hydrogen is subsequently calculated based on the density of hydrogen at atmospheric pressure and room temperature, with a corresponding concentration proportional to the cavity volume. The worst case quantity of hydrogen outgassed into several Kovar packages of standard dimensions is shown calculated in Table 1.

It has been shown that the $H_2O$ vapor inside a sealed package equivalent to Example 6 in Table 1 may be reduced to effectively zero using the technique of combining a small quantity (approximately 5 mg total mass) of the chemical getter material. One application of the method of the present invention is illustrated by the data shown in Table 2. Eight gold-plated empty Kovar packages each with an internal volume of approximately 1.35 cm were sealed in a dry box environment (dew point −40° C.). Half of the packages contained a getter according to the present invention, and half contained no getter. After sealing and leak checking (leak rate less than $10^{-7}$ mb·l/s), all parts were stored at 85° C. and underwent residual gas analysis (RGA) after 1500 hours (four parts, #1–4) and 3000 hours (four parts, #5–8).

TABLE 1

Theoretical calculations of worst-case hydrogen diffusion into representative Kovar packages

| Ex. | | Hydrogen Conc. (ppm$_w$), μg/g | Kovar Density (g/cm³) | Package dimensions | | | | | Calculated values | | |
|---|---|---|---|---|---|---|---|---|---|---|---|
| | | | | x (cm) a | y (cm) b | z (cm) c | lid thkness (cm) t2 | wall/base th. (cm) t1 | Cavity vol. (cm³) | Mass (g) | Hydrogen (ppm$_v$) |
| 1 | ORS | 0.5 | 8.36 | 0.17 | 0.17 | 0.034 | 0.038 | 0.076 | 0.0010 | 0.0422 | 119390 |
| 2 | EX. | 0.5 | 8.36 | 0.38 | 0.38 | 0.076 | 0.038 | 0.076 | 0.0110 | 0.2110 | 53411 |
| 3 | | 0.5 | 8.36 | 0.79 | 0.79 | 0.158 | 0.038 | 0.076 | 0.0986 | 0.9120 | 25691 |
| 4 | | 0.5 | 8.36 | 1.7 | 1.7 | 0.34 | 0.038 | 0.076 | 0.9826 | 4.2232 | 11939 |
| 5 | | 0.5 | 8.36 | 3.7 | 3.7 | 0.74 | 0.038 | 0.076 | 10.1306 | 20.0056 | 5485 |
| 6 | 14 pin BFLY | 0.5 | 8.36 | 1.27 | 2 | 0.77 | 0.03 | 0.1 | 1.9558 | 7.9102 | 11235 |
| 7 | | 0.75 | 8.36 | 1.27 | 2 | 0.77 | 0.03 | 0.1 | 1.9558 | 7.9102 | 16852 |
| 8 | | 2 | 8.36 | 1.27 | 2 | 0.77 | 0.03 | 0.1 | 1.9558 | 7.9102 | 44939 |
| 9 | 8 pin BFLY | 0.5 | 8.36 | 1.27 | 1.07 | 0.77 | 0.03 | 0.1 | 1.0464 | 4.2320 | 11235 |

A calculation of the hydrogen sinking capacity of the used combination provides approximately 20% overcapacity compared to the worst-case estimate in Table 1 for Example 6, combined with subsequent capacity to sink all of the resultant H$_2$O plus an additional capacity greater than 300,000 ppm$_v$ over the lifetime of the device.

TABLE 2

Residual gas analysis results for Kovar packages with and without a getter according to the present invention

| Package Attributes | | | RGA Result (%) | |
|---|---|---|---|---|
| Package # | Getter | 85° C. Storage | H20 | H2 |
| 1 | N | 1500 hours | 0.1259 | 0.0174 |
| 2 | N | 1500 hours | 0.0954 | 0.0067 |
| 3 | N | 3000 hours | 0.1559 | 0.0019 |
| 4 | N | 3000 hours | 0.1283 | 0.0000 |
| 5 | Y | 1500 hours | 0.0000 | 0.0018 |
| 6 | Y | 1500 hours | 0.0000 | 0.0008 |
| 7 | Y | 3000 hours | 0.0000 | 0.0000 |
| 8 | Y | 3000 hours | 0.0000 | 0.0000 |

Calculations may also be made to determine worst-case contamination rates for a sealed package based on estimated worst case leak rates and the predicted lifetime of the device. As noted above, a hermetically sealed package will have a finite leak rate at some level below the pass/fail criteria used for the sealing process. A common method of monitoring leak rates is to include some proportion of Helium (for example, 10%) in the gaseous environment that is sealed into the package. Consequent use of mass spectrometry methods to measure the quantity of Helium that is leaked out of the sealed package allows that pass/fail criteria to be applied. In general, the measurable leak rate is limited to approximately $10^{-8}$ mbar L s$^{-1}$, which is effectively $10^7$ mbar L s$^{-1}$ when taking into consideration the example in which the Helium makes up 10% of the gas mixture. The true leak rate of the actual gases that are sealed in the package will differ from this number, depending on their molecular weights. The partial pressure of the leaking gas will change due to the leak itself and the concentration of the initial gas remaining inside the package will decrease exponentially over time. Thus for a given cavity volume and for a measured minimum leak rate, the time taken after package sealing for the original gases inside the package to leak to the surrounding atmosphere can be calculated. As these gases leak out, the gases in the surrounding atmosphere will leak in until the atmosphere inside of the cavity reaches equilibrium. Water vapor and other contaminants from the surrounding atmosphere will thus be contained in the "sealed" package. If a package is required to operate over some specific lifetime of the enclosed device, which may be up to 10 to 25 years, it is necessary to design for this source of contamination. A getter with sufficient capacity may be used by one of ordinary skill in the art according to the teachings of the present invention to prevent the leaked-in contaminant from affecting the enclosed device and for in the case of water vapor, maintain a dry environment in the package over the device's intended lifetime and expected temperatures, i.e, keeping the dew point less than the actual temperature.

The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents.

What is claimed is:

1. A gettering system, comprising
   a sealed enclosure defining a first volume;
   a receptacle enclosing a second volume, said second volume communicating with said first volume through a partition through which one or more contaminants may diffuse from said first volume to said second volume; and
   a gettering material comprising calcium oxide (CaO) and palladium oxide (PdO) that acts to immobilize said contaminants, said gettering material being contained in said second volume and said gettering material having a physical form that precludes said gettering material from passing through said partition to said first volume.

2. The gettering system of claim 1 wherein said gettering material comprises one or more powdered and/or granular materials.

3. The gettering system of claim 1 wherein said gettering material comprises one or more solid materials.

4. The gettering system of claim 1 wherein said contaminants are airborne.

5. The gettering system of claim 4 wherein said contaminants comprise one or more of hydrogen, water, carbon dioxide, and trace organic vapors.

6. The gettering system of claim 1 wherein said contaminant is liquid water.

7. The gettering system of claim 1 wherein said partition includes a porous cup that partially defines said second volume.

8. The gettering system of claim 7 wherein said gettering material comprises one or more powdered and/or granular materials, said one or more powdered and/or granular materials having an average particle size that is substantially larger than an average pore size of said porous cup.

9. The gettering system of claim 1 wherein said porous cup is formed of a sintered powdered material selected from the group consisting of metal, metal alloy, ceramic, and glass.

10. The gettering system of claim 9 wherein the average pore size of said porous cup is in the range of approximately 0.1 to 200 microns.

11. The gettering system of claim 7 wherein
said sealed enclosure further comprises a base, one or more walls, and a sealing member that define said first volume; and
said porous cup has an open end, said open end being closed by attachment of said porous sintered cup to said sealing member.

12. The gettering system of claim 11 wherein
said gettering material expands as it immobilizes said contaminants;
said second volume defined by said porous cup is substantially filled with said gettering material; and
said porous sintered cup affixes to said sealing member at an area on said sealing member wherein the material allows said area to be outwardly deformed under pressure from said gettering material as said gettering material expands in a way that it provides a visual indication of the deformation.

13. A gettering system comprising:
a sealed package enclosing a volume, said sealed package containing an atmosphere;
a porous partition within said sealed package that divides said volume into a device subvolume and a getter subvolume, said partition having a porosity sufficient to allow gas-phase molecules to diffuse from said device subvolume to said getter subvolume; and
a gettering material comprising CaO and PdO that acts to immobilize one or more contaminants from said atmosphere, said gettering material being contained in said getter subvolume by said partition.

14. A gettering system for removing one or more contaminants from the atmosphere of a sealed enclosure, comprising:
a getter material comprising CaO and PdO in proportions suitable for immobilization of said contaminants; and
a porous cup that contains said getter material; said porous cup comprising a porous surface area through which said airborne impurities may pass from said sealed enclosure to the interior of said receptacle, said porous surface area restricting movement of said getter material out of said receptacle.

15. The gettering system of claim 14 wherein said receptacle is located inside said sealed enclosure.

16. The gettering system of claim 14 wherein said getter material is granular and/or powdered and further characterized by a particle size that is substantially larger than the average pore size of said porous surface area.

17. A gettering system for removing a gas-phase contaminant compound from the atmosphere of a sealed enclosure containing a device, comprising:
a powdered and/or granular getter composition comprising a chemical that reacts with a gas-phase contaminant to form an immobile compound, thereby removing said contaminant from the gas phase, wherein said getter material comprises CaO and PdO; and
a partition separating the volume of said sealed enclosure into a getter volume and a main volume, said main volume housing said device, said partition comprising a porous cup having a porous surface through which said one or more contaminants may diffuse but through which said getter composition may not pass, said getter volume housing a measured quantity of said getter composition.

18. The gettering system of claim 1, further comprising an optoelectronic device within the sealed enclosure.

19. The gettering system of claim 1, wherein a portion of the enclosure near the porous cup is deformable in response to the gettering of impurities to provide a visual indication of gettering activity.

20. A gettering system, comprising
a sealed enclosure defining a first volume;
a receptacle enclosing a second volume, the second volume communicating with the first volume through a partition through which one or more contaminants may diffuse from said first volume to the second volume; and
a gettering material comprising CaO and PdO contained in the second volume, the gettering material acting to immobilize the contaminants and expanding as it immobilizes the contaminants;
the enclosure having a portion that is designed to deform outwardly as the gettering material expands to provide a visual indication of the expansion.

21. The system of claim 20, wherein the portion is thinner than adjacent portions.

22. The system of claim 20, wherein the portion is made of a material that is different from that at adjacent portions.

23. The system of claim 20, further comprising an optoelectronic component in the first volume.

24. The gettering system of claim 1, 13, 14, 17, or 20, wherein said gettering material consists essentially of CaO and PdO.

25. The gettering system of claim 24, wherein said gettering material comprises approximately 98% CaO and 2% PdO by weight.

26. The gettering system of claim 11, wherein said open end of said cup is welded to said sealing member.

* * * * *